United States Patent [19]
Larsen et al.

[11] Patent Number: 5,798,971
[45] Date of Patent: Aug. 25, 1998

[54] NONVOLATILE MEMORY WITH OUTPUT MODE CONFIGURATION

[75] Inventors: Robert E. Larsen, Shingle Springs; Richard J. Durante, Folsom, both of Calif.

[73] Assignee: Intel Corporation, Santa Clara, Calif.

[21] Appl. No.: 790,234

[22] Filed: Jan. 28, 1997

Related U.S. Application Data

[63] Continuation of Ser. No. 394,397, Feb. 24, 1995, abandoned.
[51] Int. Cl.[6] ............................................. G11C 7/00
[52] U.S. Cl. .............................. 365/189.05; 326/27
[58] Field of Search ...................... 365/189.05; 326/27

[56] References Cited

U.S. PATENT DOCUMENTS

| | | | |
|---|---|---|---|
| 4,823,029 | 4/1989 | Gabara | 326/27 |
| 4,961,010 | 10/1990 | Davis | 326/27 |
| 5,132,566 | 7/1992 | Denda | 326/27 |
| 5,140,191 | 8/1992 | Nogle et al. | 326/27 |
| 5,140,195 | 8/1992 | Wakayama | 326/27 |
| 5,220,209 | 6/1993 | Seymour | 326/27 |
| 5,327,383 | 7/1994 | Merchant et al. | 365/218 |
| 5,363,330 | 11/1994 | Kobayashi et al. | 365/189.05 |
| 5,363,335 | 11/1994 | Jungroth et al. | 365/226 |
| 5,369,647 | 11/1994 | Kreifels et al. | 371/25.1 |
| 5,399,918 | 3/1995 | Taylor et al. | 326/110 |

*Primary Examiner*—David C. Nelms
*Assistant Examiner*—Michael T. Tran
*Attorney, Agent, or Firm*—Blakely, Sokoloff, Taylor & Zafman

[57] ABSTRACT

A nonvolatile memory includes a memory array and a buffer circuit for applying data read from the memory array to external circuitry. A compensation circuit is coupled to the buffer circuit for providing output compensation to the buffer circuit when enabled. The buffer circuit has (1) a first output speed when the compensation circuit is enabled and (2) a second output speed when the compensation circuit is disabled. A configuration circuit is coupled to the compensation circuit for selectively enabling the compensation circuit such that the buffer circuit can be configured between the first and second output speeds. A method of configuring a nonvolatile memory between a first output speed and a second output speed is also described.

20 Claims, 4 Drawing Sheets

NONVOLATILE MEMORY WITH OUTPUT MODE CONFIGURATION

This is a continuation of application Ser. No. 08/394,397, filed Feb. 24, 1995, now abandoned.

FIELD OF THE INVENTION

The present invention pertains to the field of computer memories. More particularly, this invention relates to an electrically erasable and programmable nonvolatile memory with output mode configuration such that the memory can dynamically be switched between different output speeds.

BACKGROUND OF THE INVENTION

One type of prior art flash Erasable and electrically Programmable Read-Only Memory ("flash EPROM") is organized into rows and columns. Memory cells are placed at intersections of word lines and bit lines. Each word line is connected to the control gates of a plurality of memory cells in one row. Each bit line is connected to the drains of a plurality of memory cells in one column. The sources of all the memory cells in one memory block are connected to a common source line of that particular block. The flash EPROM can be programmed by a user. Once programmed, the flash EPROM retains its data until erased by electrical erasure. A high erasing voltage is made available to the sources of all the cells in a memory block simultaneously. This results in a block erasure. The flash EPROM can also have a full array erasure by applying the erasing voltage to the sources of all memory cells of the flash EPROM simultaneously. The erased block or array of the flash EPROM can then be reprogrammed with new data.

Typically, in order to save time and resources, a number of flash EPROMs or EPROMs ("Electrically Programmable Read-Only Memories") are programmed by an electrical programmer before the EPROMs or flash EPROMs are installed in computer or other data processing systems. This allows a large number of flash EPROM or EPROM chips to be simultaneously programmed with the same data or codes, thus saving the overall programming time, resources, and cost.

Given that the flash EPROM is electrically erasable and programmable, a flash EPROM can also be programmed and reprogrammed within a system where it is installed without being removed from the system. This allows the flash EPROM to be individually updated.

As is known, during programming of a flash EPROM, the data or codes programmed into the flash EPROM need to be read out to determine whether the data or codes have been properly programmed into the flash EPROM. This operation is referred to as program verify operation.

A prior art flash EPROM typically includes an output compensation circuit. The output compensation circuit is typically connected to an output buffer of the flash EPROM. The output buffer is used to buffer data read from the memory array of the flash EPROM to external circuitry during a read or program verify operation. The output compensation circuit is used to lower the noise generated in the output buffer when the output compensation circuit is enabled.

One disadvantage of using the output compensation circuit in the prior art flash EPROM is that the output speed of the output buffer is typically affected when the output compensation circuit is enabled. However, the output compensation circuit cannot simply be disabled because different programming systems typically have different noise and speed requirements. For example, the programmer typically requires the flash EPROMs to have lower output noise than that allowed in a typical computer system. As a further example, a computer system typically requires its flash EPROMs to have a relative high output speed. Low output noise typically means low output speed while high output speed typically is accompanied with high output noise.

SUMMARY OF THE INVENTION

One of the features of the present invention is to provide a reprogrammable nonvolatile memory the output speed of which can be dynamically changed.

Another feature of the present invention is to provide a reconfigurable reprogrammable nonvolatile memory.

A further feature of the present invention allows a reprogrammable nonvolatile memory to optimize its output speed in different environments.

A nonvolatile memory includes a memory array and a buffer circuit for applying data read from the memory array to external circuitry. A compensation circuit is coupled to the buffer circuit for providing output compensation to the buffer circuit when enabled. The buffer circuit has (1) a first output speed when the compensation circuit is enabled and (2) a second output speed when the compensation circuit is disabled. A configuration circuit is coupled to the compensation circuit for selectively enabling the compensation circuit such that the buffer circuit can be configured between the first and second output speeds.

A method of configuring a nonvolatile memory between a first output speed and a second output speed is also described. The method includes a step of detecting if an elevated high voltage is applied to an address input of the nonvolatile memory. A compensation circuit coupled to a buffer circuit of the nonvolatile memory is enabled to configure the nonvolatile memory with the first output speed if the elevated high voltage is detected at the address input of the nonvolatile memory. The compensation circuit is not enabled to configure the nonvolatile memory with the second output speed if the elevated high voltage is not detected at the address input of the nonvolatile memory.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
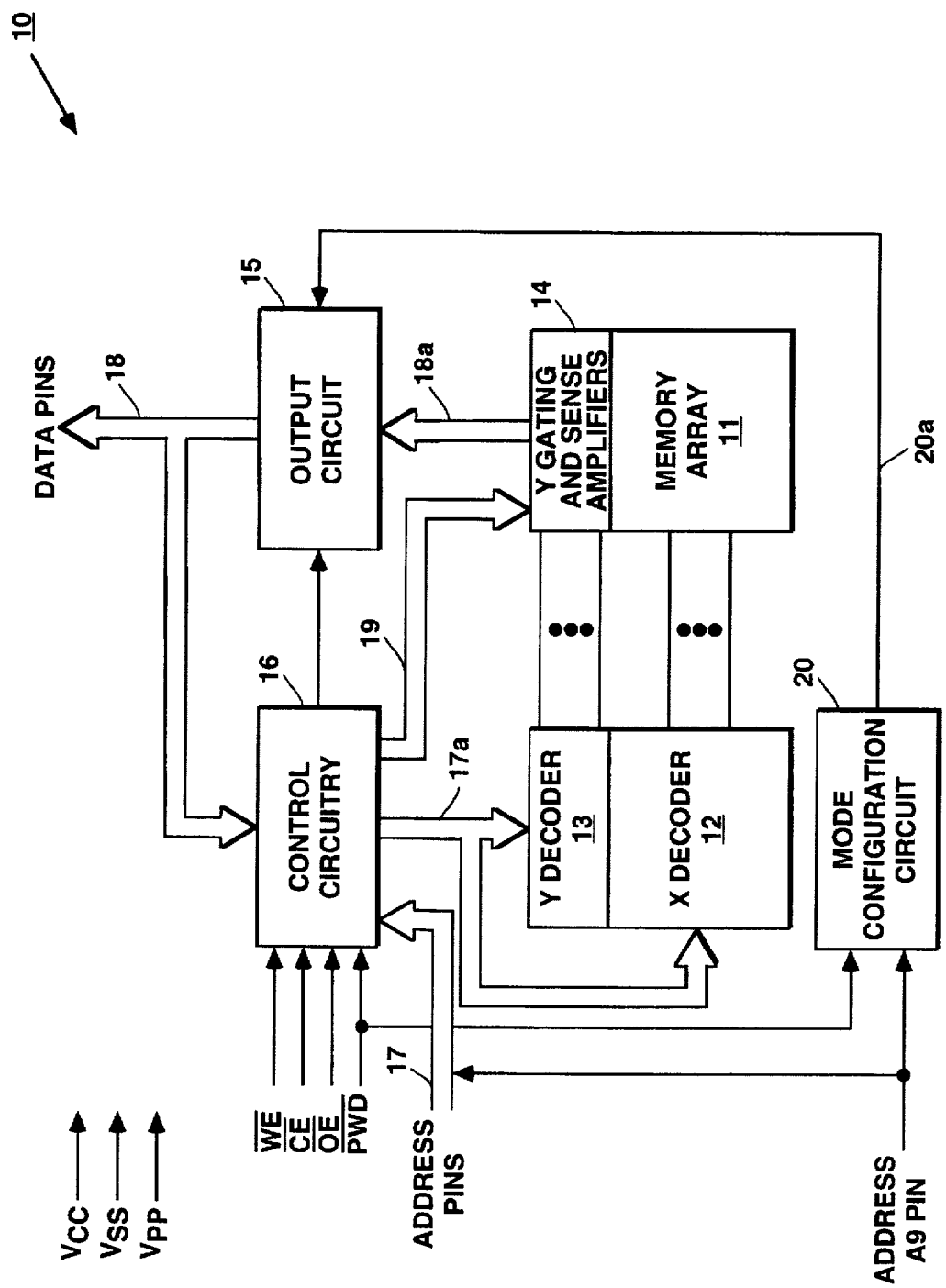
FIG. 1 is a block diagram of a flash EPROM that includes an output circuit and a mode configuration circuit that implements an embodiment of the present invention.

FIG. 1 is a block diagram of the circuitry of flash EPROM 10, which implements an embodiment of the present invention. Flash EPROM 10 includes a memory array 11, which is made up of floating gate flash EPROM cells that store data at addresses. For one embodiment, memory array 11 stores 8 Mbits ("Megabits") of data. For alternative embodiments, memory array 11 can be smaller than or larger than 8 Mbits.

Alternatively, flash EPROM 10 can be other types of nonvolatile memories. For example, flash EPROM can be simply an EPROM.

Flash EPROM 10 can be used in any kind of computer systems or data processing systems. The computer system can be a personal computer, a notebook, a laptop, a personal assistant, a minicomputer, a workstation, a mainframe, a multiprocessor computer, or any other type of computer system. In addition, the system in which flash EPROM 10 is used can be a printer, a cellular phone, a digital answering system, or any other data storage system.

For one embodiment, flash EPROM 10 employs MOS circuitry and all the circuitry of flash EPROM 10 resides on a single semiconductor substrate.

Flash EPROM 10 includes an X decoder 12 and a Y decoder 13 coupled to memory array 11. X decoder 12 is the row decoder of memory array 11 and Y decoder 13 is the column decoder of memory array 11. X decoder 12 is coupled to the word lines of memory array 11. Y decoder 13 is coupled to the bit lines of memory array 11 via Y gating and sense amplifiers 14. X and Y decoders 12 and 13 receive the respective X and Y addresses via bus 17a.

Flash EPROM 10 also includes control circuitry 16. Control circuitry 16 controls the memory operations of flash EPROM 10. The memory operations include read, programming, and erasure operations. Control circuitry 16 can be implemented by any known flash EPROM control circuit. For example, U.S. Pat. Nos. 5,369,647 and 5,327,383 describe a control circuit for controlling the memory operations of a flash EPROM. Therefore, the structure and function of control circuitry 16 will not be described in more detail below.

Briefly, control circuitry 16 includes an address buffer (not shown in FIG. 1) for buffering addresses received from address pins of flash EPROM 10 via bus 17. The addresses are then applied to decoders 12 and 13 via bus 17a. Control circuitry 16 also includes a data input buffer (also not shown in FIG. 1) for receiving data to be written into memory array 11 from data pins of flash EPROM 10 via bus 18. The data input buffer of control circuitry 16 then applies the data to memory array 11 via bus 19 and Y gating 14 during a programming operation.

Control circuitry 16 also includes command state circuitry and write state circuitry (all are not shown in FIG. 1). The write state circuitry regulates the memory operations of flash EPROM 10 after an initiating command is received in the common state circuitry. The command state circuitry receives the initiating command from the data pins of flash EPROM 10 via bus 18. The command state circuitry decodes the command received and generates the appropriate control signals to the write state circuitry.

Control circuitry 16 receives control signals. These control signals are a chip enable control signal $\overline{CE}$, an output enable control signal $\overline{OE}$, a write enable control signal $\overline{WE}$, and a power down control signal $\overline{PWD}$. The chip enable $\overline{CE}$ signal is the power control signal for flash EPROM 10 and is used for device selection of flash EPROM 10. The output enable $\overline{OE}$ signal is the output control for flash EPROM 10, dependent on device selection. The write enable control signal $\overline{WE}$ allows writes to control circuitry 16 while the chip enable control signal $\overline{CE}$ is active low.

The $\overline{PWD}$ control signal is an active low power down control signal. A logical low $\overline{PWD}$ signal causes flash EPROM 10 to enter the power down mode. When flash EPROM 10 enters the power down mode, all circuits of flash EPROM 10 are powered off. Flash EPROM 10 returns to its normal operational modes when the $\overline{PWD}$ control signal rises to logical high. For another embodiment, the $\overline{PWD}$ control signal may also include a high voltage signal.

Moreover, control circuitry 16 includes registers (also not shown in FIG. 1) that store device ID ("identification") and other device information for flash EPROM 10. The device ID and other device information can be read from the registers in control circuitry 16 when flash EPROM 10 is placed in a particular mode. This particular mode is entered when a high voltage (i.e., $V_{PP}$) is applied to an A9 address pin of flash EPROM 10. Alternatively, the particular mode can be entered by writing a special command to control circuitry 16.

Alternatively, the $V_{PP}$ high voltage can be applied to another address pin of flash EPROM 10 to cause flash EPROM 10 to enter the particular mode. When flash EPROM 10 enters the particular mode, the device ID and other device information are then read to the external circuitry via the data pins and bus 18.

$V_{PP}$ is the program/erase power supply voltage for flash EPROM 10. $V_{CC}$ is the device power supply voltage for flash EPROM 10 and $V_{SS}$ is ground. For one embodiment, $V_{PP}$ is approximately 12 volts.

$V_{CC}$ can be selected from a number of power supply volts. For one embodiment, $V_{CC}$ can be at approximately either 5 volts or 3.3 volts. For alternative embodiments, $V_{CC}$ can be selected from more or fewer than two power supply voltages.

Flash EPROM 10 also includes an output circuit 15. Output circuit 15 is connected to the data pins of flash EPROM 10 via bus 18. As can be seen from FIG. 1, bus 18 is a bi-directional bus that can apply data from output circuit 15 to the data pins and can also apply data and commands from the data pins to control circuitry 16.

Figure 3:
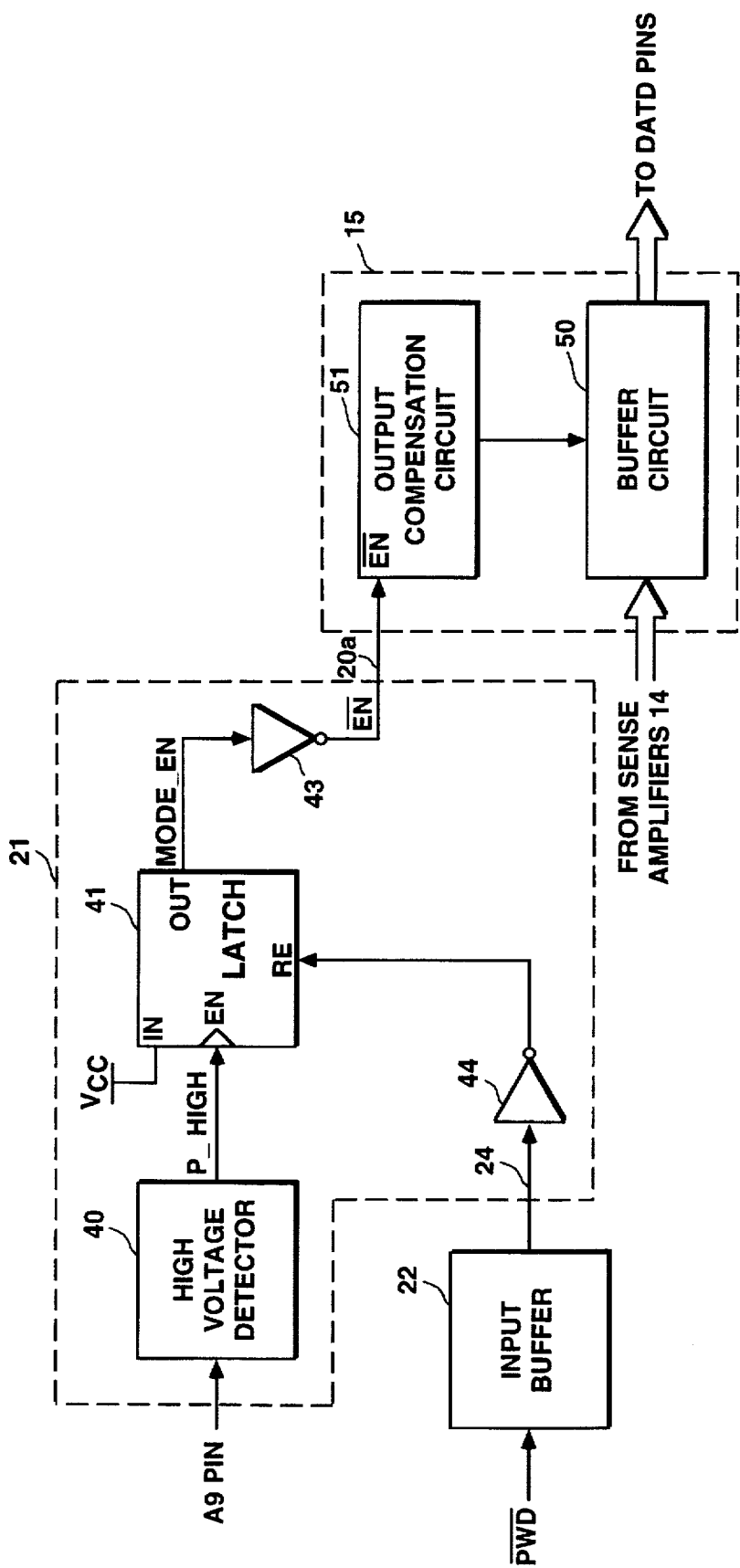
FIG. 3 shows the circuit structure of the mode configuration circuit and the output circuit of FIGS. 1–2.

Output circuit 15 includes a buffer circuit and an output compensation circuit (shown in FIG. 3). When the output compensation circuit is enabled, output circuit 15 is in a low noise and low output speed mode. When the output compensation circuit is disabled, output circuit 15 is in a high noise and high output speed mode. The structure of output circuit 15 will be described in more detail below, also in conjunction with FIG. 3.

Output circuit 15 is connected to memory array 11 via bus 18a and Y gating and sense amplifiers 14. Data stored in memory array 11 can be read to output circuit 15 via Y gating and sense amplifiers 14 during a read operation. Output circuit 15 then applies the data to external circuitry (not shown) via the data pins. Output circuit 15 is controlled by control circuitry 16 to receive the data via bus 18a and to apply the data to the data pins via bus 18.

Flash EPROM 10 also includes a mode configuration circuit 20. Mode configuration circuit 20 is used to configure the output speed of output circuit 15. Mode configuration circuit 20 is connected to output circuit 15 via line 20a. Mode configuration circuit 20 is also connected to receive the A9 address bit signal and the $\overline{PWD}$ signal. Alternatively, the address bit signal applied to mode configuration circuit 20 can be any other address pin. Mode configuration circuit 20 and output circuit 15 will be described in more detail below, in conjunction with FIGS. 2–4.

Briefly, mode configuration circuit 20 detects when the A9 pin of flash EPROM 10 is applied with the $V_{PP}$ high voltage. As described above, the $V_{PP}$ high voltage at the A9 address pin causes flash EPROM 10 to enter the particular mode in which the device ID and other device information of flash EPROM 10 are read. When the $V_{PP}$ high voltage is then removed from the A9 pin, mode configuration circuit 20 causes output circuit 15 to be configured to a low noise and low output speed mode. Mode configuration circuit 20 can then cause output circuit 15 to return to the high noise and high output speed mode when the $\overline{PWD}$ signal is actively low, which also brings flash EPROM 10 into the power down mode.

Figure 2:
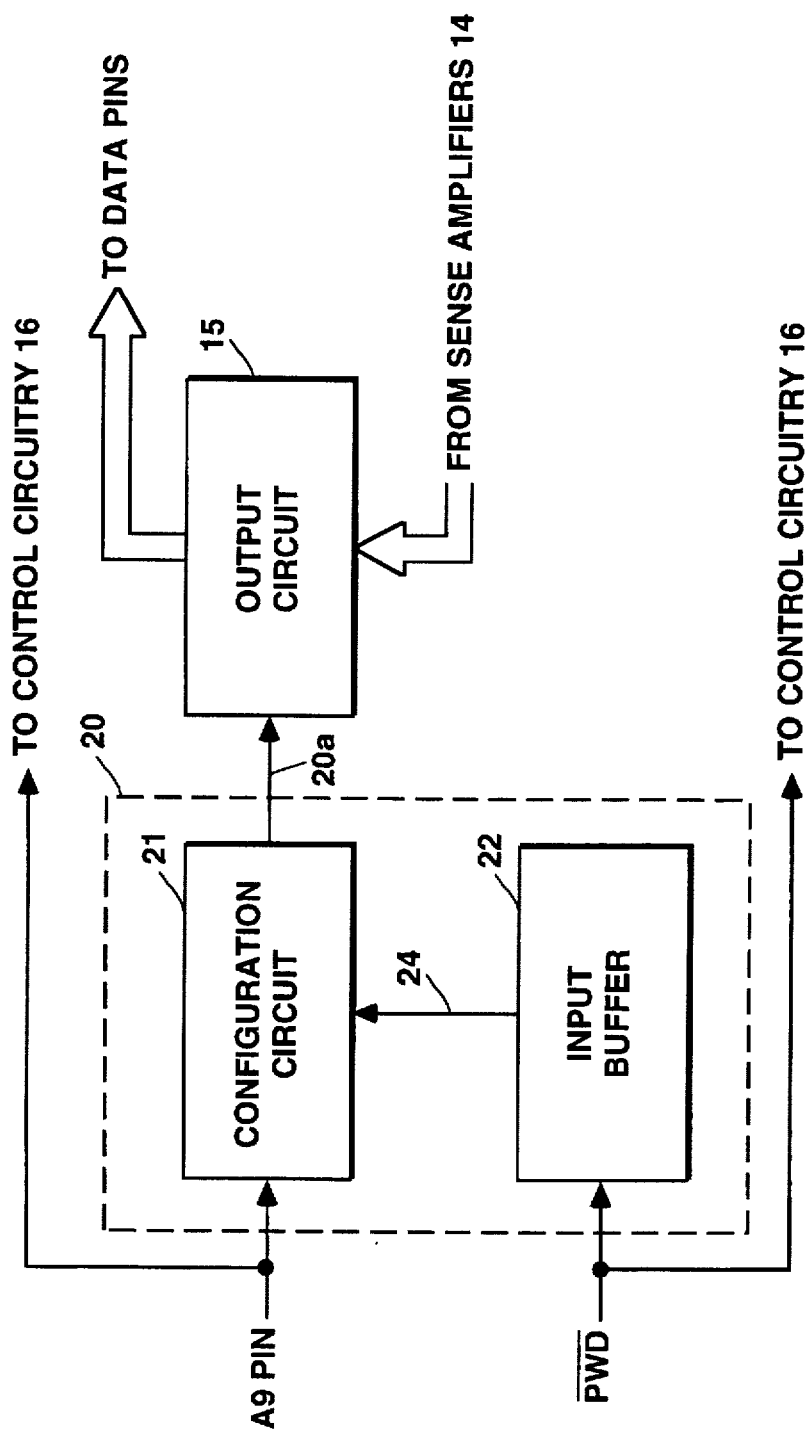
FIG. 2 is a block diagram of the mode configuration circuit and the output circuit of FIG. 1.

Referring to FIG. 2, mode configuration circuit 20 includes a configuration circuit 21 and an input buffer 22. Configuration circuit 21 is connected to receive the A9 address signal. Input buffer 22 is connected to receive the $\overline{PWD}$ signal. Input buffer 22 buffers the $\overline{PWD}$ signal and then applies the buffered $\overline{PWD}$ signal to configuration circuit 21 via line 24. Input buffer 22 can be implemented by any known buffer circuit. Configuration circuit 21 is connected to output buffer 15 via line 20a. Configuration circuit 21 applies its control signals to output circuit 15 via line 20a in order to dynamically configure output circuit 15.

FIG. 3 shows the structure output circuit 15 and configuration circuit 21 of mode configuration circuit 20. As can be seen from FIG. 3, output circuit 15 includes buffer circuit 50 and output compensation circuit 51. Buffer circuit 50 includes a number of identical buffers or registers (not shown), each for buffering one bit of data. Output compensation circuit 51 also includes a number of identical compensation circuits, each being connected to one of the buffers of buffer circuit 50. Each of the buffers of buffer circuit 50 can be implemented by any known buffer circuit. In addition, each of the compensation circuits of output compensation circuit 51 can be implemented by any known output compensation circuit.

The function of each of the compensation circuits in output compensation circuit 51, when enabled, is to lower the noise occurred in the corresponding buffer of buffer circuit 50. When this occurs, the output speed of the buffers of buffer circuit 50 is also slowed. When compensation circuit 51 is disabled, the noise occurred in buffer circuit 50 is not compensated and the output speed of buffer circuit 50 is not slowed.

Output compensation circuit 51 receives an enable signal $\overline{EN}$ at its EN input. The $\overline{EN}$ signal, when asserted, causes output compensation circuit 51 to be enabled to lower the noise of buffer circuit 50. When the $\overline{EN}$ signal is not asserted, output compensation circuit 51 is not enabled to lower the noise occurred in buffer circuit 50. As described above, buffer circuit 50 has a high output speed when output compensation circuit 51 is not enabled and a low output speed when output compensation circuit 51 is enabled.

As can be seen from FIG. 3, the $\overline{EN}$ signal is generated in and supplied by configuration circuit 21. By asserting the $\overline{EN}$ signal, configuration circuit 21 causes output circuit 15 to have the low output speed with low output noise. When configuration circuit 21 deasserts the $\overline{EN}$ signal, the configuration circuit 21 configures output circuit 15 to have the high output speed with high output noise.

Figure 4:
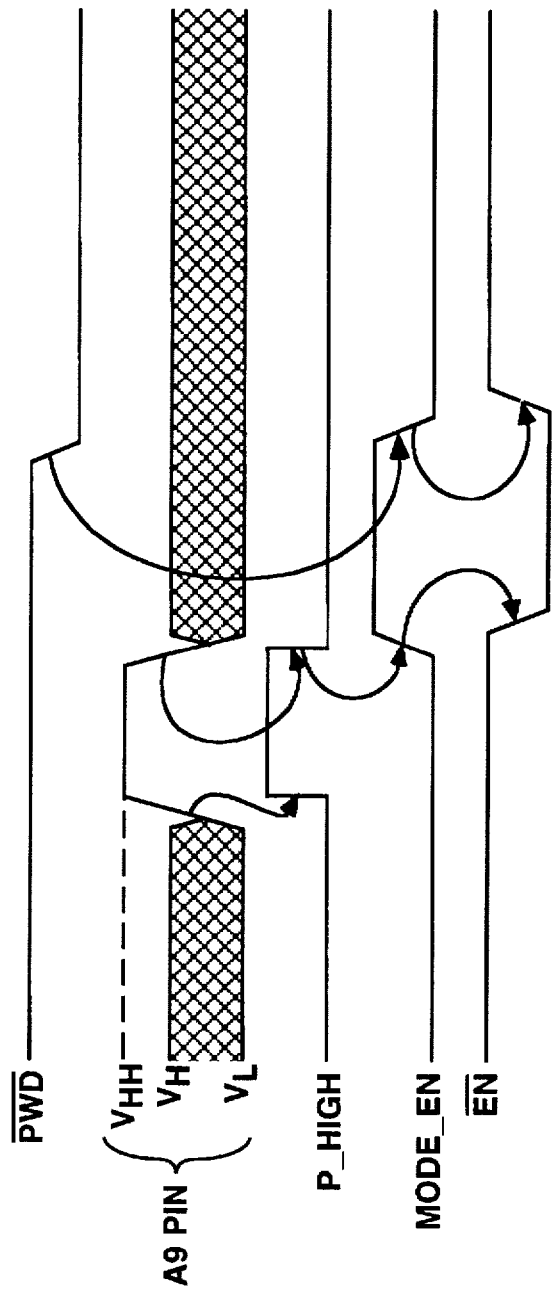
FIG. 4 is a timing diagram showing the relationship of various signals applied to the mode configuration circuit.

As can be seen from FIG. 3, configuration circuit 21 includes a high voltage detector 40. High voltage detector 40 is connected to the A9 address pin of flash EPROM 10. High voltage detector 40 can be implemented by any known high voltage detection circuit. High voltage detector 40 detects whether the $V_{PP}$ high voltage is applied to the A9 pin. If so, high voltage detector 40 generates a P_HIGH signal to a latch circuit 41. When the $V_{PP}$ high voltage is removed from the A9 address pin, high voltage detector 40 deasserts the P_HIGH signal. The signal waveform of the P_HIGH signal is shown in FIG. 4, which will be described in more detail below.

The P_HIGH signal is applied to an EN input of latch 41. Latch 41 can be implemented by any known latch circuit.

The input of latch 41 is connected to the $V_{CC}$ voltage. This causes latch 41 to remain applied with the logical one value. Whether latch 41 stores the logical one value depends on the P_HIGH signal applied at the EN input of latch 41.

Latch 41 is a falling edge triggered latch. This means latch 41 is triggered to store the data applied at its IN input when the P_HIGH signal is deasserted from the asserted state (i.e., from logical high to logical low). This means latch 41 is triggered to receive the data at the IN input whenever the $V_{PP}$ high voltage is applied to and then removed from the A9 address pin. In other words, latch 41 is triggered by the falling edge of the P_HIGH signal.

Since the IN input of latch 41 is tied to the $V_{CC}$ voltage, the output signal MODE_EN will never be deasserted unless it is reset by a reset signal applied at the reset RE input of latch 41. The reset signal is the inverted signal of the buffered $\overline{PWD}$ signal. Alternatively, latch 41 can be other types of latches. For example, latch 41 can be a rising edge triggered latch.

The output signal MODE_EN of latch 41 is then applied to the EN input of output compensation circuit 51 via an inverter 43. The output signal of inverter 43 is the $\overline{EN}$ signal. The signal waveforms of P_HIGH signal, the $\overline{PWD}$ signal, the MODE_EN signal, and the $\overline{EN}$ signal are shown in FIG. 4, which will be described in more detail below.

Referring now to FIGS. 2-4, the operation of mode configuration circuit 20 is described. Initially, latch 41 is reset upon device power-up. This causes the MODE_EN signal to be deasserted that causes output compensation circuit 51 to be disabled. When the $V_{PP}$ high voltage is applied to the A9 pin, high voltage detector 40 detects the $V_{PP}$ voltage and asserts the P_HIGH signal. Because latch 41 is a falling edge triggered latch, latch 41 does not change its stored values and its output signal MODE_EN remains logically inactive low.

When high voltage detector 40 detects that the $V_{PP}$ high voltage has been removed from the A9 pin, high voltage detector 40 deasserts the P_HIGH signal which in turn causes latch 41 to store the logical high value applied at its IN input (see FIG. 4). At this time, the $\overline{PWD}$ signal is logically inactive. This then causes the MODE_EN signal and the $\overline{EN}$ signal to be asserted. The asserted $\overline{EN}$ signal then causes output compensation circuit 51 to be enabled which allows output circuit 15 to have the low output speed with low output noise.

Output circuit 15 remains in the low output speed until the $\overline{PWD}$ signal is asserted. As described above, when the $\overline{PWD}$ signal is asserted, flash EPROM 10 enters the power down mode in which substantially all circuits of flash EPROM 10 is powered off. In addition, the asserted $\overline{PWD}$ signal also resets latch 41 of configuration circuit 21.

When the $\overline{PWD}$ signal is asserted, latch 41 is reset which causes the MODE_EN signal and the $\overline{EN}$ signal to be deasserted (FIG. 4). The deasserted $\overline{EN}$ signal then disables output compensation circuit 51 of output circuit 15. This then causes output circuit to have the high output speed with high output noise.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A nonvolatile memory, comprising:
   (A) a memory array;
   (B) a buffer circuit for applying data read from the memory array to external circuitry;
   (C) a compensation circuit coupled to the buffer circuit form providing programmable output compensation to the buffer circuit when enabled, wherein the buffer circuit has (1) a first prespecified output speed when the compensation circuit is enabled and (2) a second prespecified output speed when the compensation circuit is disabled;
   (D) a configuration circuit coupled to the compensation circuit for selectively enabling the compensation circuit such that the buffer circuit can be configured to selectively output at the first prespecified output speed or second prespecified output speed.

2. The nonvolatile memory of claim 1, wherein the configuration circuit detects a state of an address input to selectively enable the compensation circuit.

3. The nonvolatile memory of claim 2, wherein when the configuration circuit detects an elevated high voltage at the address input, the configuration circuit enables the compensation circuit, wherein when the configuration circuit does not detect the elevated high voltage at the address input, the configuration circuit does not enable the compensation circuit.

4. The nonvolatile memory of claim 3, wherein when the compensation circuit is enabled, the compensation circuit is disabled by the configuration circuit when the configuration circuit detects a power down signal at a power down input of the nonvolatile memory.

5. The nonvolatile memory of claim 4, wherein the elevated high voltage is approximately 12 volts, wherein the power down signal is a logical low signal.

6. The nonvolatile memory of claim 1, wherein the nonvolatile memory includes memory cells that are electrically programmable and erasable.

7. A nonvolatile memory, comprising:
   (A) a memory array;
   (B) a buffer circuit for applying data read from the memory array to external circuitry;
   (C) a compensation circuit coupled to the buffer circuit for providing programmable output compensation to the buffer circuit such that the buffer circuit has a first prespecified output speed, wherein the buffer circuit has a second prespecified output speed when the compensation circuit is disabled;
   (D) a configuration circuit coupled to the compensation circuit for selectively enabling the compensation circuit such that the buffer circuit can be configured to selectively output at the first prespecified output speed or second prespecified output speed, further comprising
     (i) a high voltage detector for generating a high voltage indication signal when an elevated high voltage is applied to an address input;
     (ii) an enable circuit for enabling the compensation circuit in accordance with the high voltage indication signal from the high voltage detector.

8. The nonvolatile memory of claim 7, wherein the enable circuit further comprises an edge triggered latch.

9. The nonvolatile memory of claim 8, wherein when the high voltage detector does not detect the elevated high voltage at the address input, the enable circuit does not enable the compensation circuit.

10. The nonvolatile memory of claim 9, wherein the latch is also coupled to a power down input of the nonvolatile memory, wherein the latch is reset by a power down signal applied at the power down input, where when the latch is reset, the latch disables the compensation circuit.

11. The nonvolatile memory of claim 10, wherein the elevated high voltage is approximately 12 volts, wherein the power down signal is a logical low signal.

12. The nonvolatile memory of claim 7, wherein the nonvolatile memory includes memory cells that are electrically programmable and erasable.

13. The nonvolatile memory of claim 7, wherein the address input is an A9 address bit of an address.

14. A method of programmably configuring a nonvolatile memory between a first prespecified output speed and a second prespecified output speed, comprising the steps of:
   (A) detecting if an elevated high voltage is applied to an address input of the nonvolatile memory;
   (B) enabling a compensation circuit coupled to a buffer circuit of the nonvolatile memory to configure the nonvolatile memory with the first prespecified output speed if the elevated high voltage is applied to the address input of the nonvolatile memory;
   (C) not enabling the compensation circuit to configure the nonvolatile memory with the second prespecified output speed if the elevated high voltage is not applied to the address input of the nonvolatile memory.

15. The method of claim 14, wherein the step (B) further comprises the step of disabling the compensation circuit, after the compensation circuit has been enabled, by causing the nonvolatile memory to enter a power down mode.

16. The method of claim 14, wherein the elevated high voltage is approximately 12 volts.

17. A computer system, comprising:
   (a) a microprocessor;
   (b) a nonvolatile memory, comprising:
     (A) a memory array;
     (B) a buffer circuit for applying data read from the memory array to external circuitry;
     (C) a compensation circuit coupled to the buffer circuit for providing programmable output compensation to the buffer circuit when enabled, wherein the buffer circuit has (1) a first prespecified output speed when the compensation circuit is enabled and (2) a second prespecified output speed when the compensation circuit is disabled;
     (D) a configuration circuit coupled to the compensation circuit for selectively enabling the compensation circuit such that the buffer circuit can be selectively configured at the first and second prespecified output speeds.

18. The computer system of claim 17, wherein the configuration circuit detects the voltage of an address input to selectively enable the compensation circuit.

19. The computer system of claim 18, wherein when the configuration circuit detects an elevated high voltage at the address input, the configuration circuit enables the compensation circuit, wherein when the configuration circuit does not detect the elevated high voltage at the address input, the configuration circuit does not enable the compensation circuit.

20. The computer system of claim 19, wherein when the compensation circuit is enabled, the compensation circuit is disabled by the configuration circuit when the configuration circuit detects a power down signal at a power down input of the nonvolatile memory.

* * * * *